United States Patent
Sato et al.

(10) Patent No.: US 8,629,055 B2
(45) Date of Patent: Jan. 14, 2014

(54) MANUFACTURING METHOD OF SEMICONDUCTOR DEVICE

(75) Inventors: Tsukasa Sato, Kawasaki (JP); Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 962 days.

(21) Appl. No.: 12/565,333

(22) Filed: Sep. 23, 2009

(65) Prior Publication Data

US 2010/0009544 A1     Jan. 14, 2010

Related U.S. Application Data

(63) Continuation of application No. PCT/JP2007/056842, filed on Mar. 29, 2007.

(51) Int. Cl.
*H01L 21/316* (2006.01)

(52) U.S. Cl.
USPC ........... 438/623; 438/624; 438/761; 438/763; 438/782

(58) Field of Classification Search
USPC ..................... 438/761, 763, 623, 624, 782; 257/E21.267
See application file for complete search history.

(56) References Cited

U.S. PATENT DOCUMENTS

| | | | | |
|---|---|---|---|---|
| 5,532,191 A * | 7/1996 | Nakano et al. | ................ | 438/692 |
| 6,010,963 A * | 1/2000 | Allman et al. | ................ | 438/690 |
| 6,187,662 B1 * | 2/2001 | Usami et al. | ................ | 438/624 |
| 6,635,586 B2 * | 10/2003 | Goo et al. | ..................... | 438/782 |
| 2005/0164520 A1 | 7/2005 | Muranaka et al. | | |
| 2007/0108489 A1 * | 5/2007 | Nagai | ........................... | 257/295 |

FOREIGN PATENT DOCUMENTS

| | | | |
|---|---|---|---|
| JP | 63-281432 A | | 11/1988 |
| JP | 4-342135 A | | 11/1992 |
| JP | 05-055391 | * | 3/1993 |
| JP | 5-55391 A | | 3/1993 |
| JP | 07-153759 A | | 6/1995 |
| JP | 08-321543 | * | 12/1996 |
| JP | 08-321543 A | | 12/1996 |
| JP | 2000-058646 | * | 2/2000 |
| JP | 2000-58646 A | | 2/2000 |
| JP | 3158288 B2 | | 4/2001 |
| JP | 2005-5602 A | | 1/2005 |
| JP | 2005-340266 A | | 12/2005 |

OTHER PUBLICATIONS

Notification of Transmittal of Translation of the International Preliminary Report on Patentability (Form PCT/IB/338) of International Application No. PCT/JP2007/056842 mailed Mar. 29, 2007 with forms PCT/IB/373 and PCT/ISA/237.
International Search Report of PCT/JP2007/056842, Mailing Date of Jun. 26, 2007.

* cited by examiner

*Primary Examiner* — Michael Trinh
(74) *Attorney, Agent, or Firm* — Westerman, Hattori, Daniels & Adrian, LLP

(57) ABSTRACT

A coating solution of SOG is applied on a silicon oxynitride film (11) and precured. As a result, moisture contained in the coating solution volatilizes, and an SOG film (12) is formed. Next, a coating solution of SOG is applied on the SOG film (12) and precured. As a result, an SOG film (13) is formed. Thereafter, a coating solution of SOG is applied on the SOG film (13) and precured. As a result, an SOG film (14) is formed. Subsequently, a main cure of the SOG films (12, 13, and 14) is performed. The viscosity of the coating solution of SOG used for forming the SOG film (12) is lower than those of the coating solutions of SOG used for forming the SOG films (13 and 14).

20 Claims, 17 Drawing Sheets

US 8,629,055 B2

MANUFACTURING METHOD OF SEMICONDUCTOR DEVICE

CROSS-REFERENCE TO RELATED APPLICATIONS

This application is a Continuation of International Application No. PCT/JP2007/056842, with an international filing date of Mar. 29, 2007, which designating the United States of America, the entire contents of which are incorporated herein by reference.

TECHNICAL FIELD

The present invention relates to a manufacturing method of a semiconductor device suitable for forming a multilayer wiring structure.

BACKGROUND ART

In recent years, with high integration of a semiconductor device, a multilayer wiring structure is applied. In the multilayer wiring structure, flattening a surface of an interlayer insulating film is required. This is to prevent exposure displacement and the like in forming a wiring to be formed on the interlayer insulating film. As techniques to obtain a flat interlayer insulating film, the following techniques are applied.

(1) A technique in which an insulating film is formed by using ozone-boron phosphorus silicate glass ($O_3$-BPSG), and thereafter, a reflow is performed thereby flattening the surface of the insulating film (2) A technique in which an insulating film is formed by a chemical vapor deposition method (a CVD method) under reduced pressure, and thereafter, etching back is performed thereby flattening the surface of the insulating film (3) A technique in which a first insulating film is formed by a CVD method under reduced pressure, and thereafter, a second insulating film is formed on the first insulating film by using SOG (Spin On Glass)

(4) A technique in which an insulating film is formed by a plasma CVD method using TEOS (tetraethylorthosilicate), and thereafter, a CMP (Chemical Mechanical Polishing) is performed thereby flattening the surface of the insulating film (5) A technique in which an insulating film is formed by a high density plasma CVD method, and thereafter, a CMP is performed thereby flattening the surface of the insulating film Here, the technique (3) will be explained. FIG. 9A to FIG. 9G are cross-sectional views showing a conventional manufacturing method of a semiconductor device in order of steps.

First, as illustrated in FIG. 9A, an element isolation insulating film 102 is formed on a surface of a semiconductor substrate 101 composed of silicon or the like. Next, an ion implantation of B (boron) is performed in the surface of an element region demarcated by the element isolation insulating film 102 thereby forming a P-well 103. Next, gate insulating films 104 and gate electrodes 105 are formed on the P-well 103. Thereafter, an ion implantation of P (phosphorus) is performed in the surface of the P-well 103 thereby forming shallow impurity diffusion layers 106. Subsequently, sidewall insulating films 107 are formed on lateral sides of the gate electrodes 105. Next, an ion implantation of As (arsenic) is performed in the surface of the P-well 103 thereby forming deep impurity diffusion layers 108. Thus, transistors Tr are formed. Note that the single transistor Tr includes the two impurity diffusion layers 108, and one of them is shared with another transistor Tr. The impurity diffusion layer 108 that is shared constitutes a drain, and the impurity diffusion layer 108 that is not shared constitutes a source.

Next, as illustrated in FIG. 9B, a silicon oxynitride film 111 covering the transistors Tr is formed, and an SOG film 112 is formed thereon. In forming the SOG film 112, a coating solution of SOG is applied on the silicon oxynitride film 111, and thereafter the coating solution of SOG is cured.

Thereafter, as illustrated in FIG. 9C, a resist pattern 191 having openings at positions matching the impurity diffusion layers 108 is formed on the SOG film 112. Then, etching of the SOG film 112 and the silicon oxynitride film 111 is performed by using the resist pattern 191 as a mask thereby forming contact holes 115s reaching the sources and a contact hole 115d reaching the drain.

Subsequently, as illustrated in FIG. 9D, the resist pattern 191 is removed. Next, a barrier metal film (not-illustrated) is formed on the entire surface, and a tungsten film (not-illustrated) is formed thereon. Then, the tungsten film and the barrier metal film are polished until the SOG film 112 is exposed. As a result, contact plugs 116s are formed in the contact holes 115s, and a contact plug 116d is formed in the contact hole 115d.

Next, as illustrated in FIG. 9E, wirings 117 in contact with the contact plugs 116s and 116d are formed. Thereafter, a silicon oxynitride film 118 covering the wirings 117 is formed, and an SOG film 122 is formed thereon. In forming the SOG film 122, a coating solution of SOG is applied on the silicon oxynitride film 118, and thereafter the coating solution of SOG is cured. Subsequently, an NSG film 125 is formed on the SOG film 122 by a plasma CVD method using TEOS or the like.

Next, as illustrated in FIG. 9F, a resist pattern 192 having openings at positions matching the wirings 117 is formed on the NSG film 125. Then, etching of the NSG film 125 and so on is performed by using the resist pattern 192 as a mask thereby forming contact holes 126 reaching the wirings 117.

Next, as illustrated in FIG. 9G, the resist pattern 192 is removed. Next, a barrier metal film (not-illustrated) is formed on the entire surface, and a tungsten film (not-illustrated) is formed thereon. Then, the tungsten film and the barrier metal film are polished until the NSG film 125 is exposed. As a result, contact plugs 127 are formed in the contact holes 126. Thereafter, upper layer wirings and so on are formed.

However, in the conventional techniques of (1) and (2), embedding by the insulating film is not sufficient in a region where an interval of a level difference due to the gate electrode, the wiring, or the like is wide.

In the conventional technique of (3), as illustrated in FIG. 10A, there is sometimes a case when a void 151 is caused between the SOG film 112 and the silicon oxynitride film 111 in a region where an interval between the gate electrodes 105 is narrow. Then, as illustrated in FIG. 10B, there is sometimes a case when the void 151 and the contact hole 115d get connected. In this case, degas and the like from the silicon oxynitride film 111 are likely to be gathered into the void 151 after the contact plug 116d is formed. Therefore, as illustrated in FIG. 10C, thereafter, deformation or the like of the contact plug 116d is caused, and there is sometimes a case when contact resistance rises.

Further, in the conventional technique of (3), as illustrated in FIG. 11A, in a region where an interval between the wirings 117 is narrow, there is sometimes a case when a void 152 is caused between the SOG film 122 and the silicon oxynitride film 118. Then, as illustrated in FIG. 11B, based on the void 152, there is sometimes a case when a crack 153 is caused in the SOG film 122, the NSG film 125, and the like. Further, as illustrated in FIG. 11C, there is sometimes a case when the void 152 is propagated to the contact hole 126. In this case as well, problems such as a rise of contact resistance are caused.

These voids 151 and 152 are likely to be caused in a portion close to an edge of the semiconductor substrate 101 having a disk shape. The voids 151 and 152 are sometimes called whiskers.

In the conventional technique of (4) as well, similarly to the conventional technique of (3), there is sometimes a case when a void is caused. Further, a time taken for forming the insulating film is long. Further, due to a CMP, the number of steps and cost are increased, and throughput drops.

In the conventional technique of (5) as well, a time taken for forming the insulating film is long. Further, due to a CMP, the number of steps and cost are increased, and throughput drops.

Note that, with respect to the conventional technique of (3), there exists a technique in which the silicon oxynitride film 118 is changed to an NSG film or the like, but the same problem is caused. Further, in place of forming the SOG film 112, there exists a technique in which the conventional technique of (4) is applied to form an insulating film, but a problem in the conventional technique of (4) remains.

Patent Document 1: Japanese Laid-open Patent Publication No. 2005-340266
Patent Document 2: Japanese Laid-open Patent Publication No. 7-153759
Patent Document 3: Japanese Laid-open Patent Publication No. 63-281432
Patent Document 4: Japanese Patent No. 3158288

SUMMARY OF THE INVENTION

An object of the present invention is to provide a manufacturing method of a semiconductor device in which an insulating film having a flat surface can be obtained without causing a void.

In a manufacturing method of a semiconductor device according to the present invention, a structure having a level difference is formed above a semiconductor substrate, and a first coating-type insulating film covering the structure is formed with using a first coating solution. A second coating-type insulating film thicker than the height of the structure is formed on the first coating-type insulating film with using a second coating solution whose viscosity is higher than that of the first coating solution.

DETAILED DESCRIPTION OF THE PREFERRED EMBODIMENTS

Hereinafter, embodiments of the present invention will be explained concretely with reference to the attached drawings. In these embodiments, a semiconductor device provided with a logic circuit portion, a peripheral circuit portion, and a pad portion is manufactured. However, in the following explanation, the logic circuit portion will be mainly explained.

First Embodiment

First, a first embodiment of the present invention will be explained. FIG. 1A to FIG. 1J are cross-sectional views showing a manufacturing method of a semiconductor device according to the first embodiment of the present invention in order of steps.

Figure 1A:
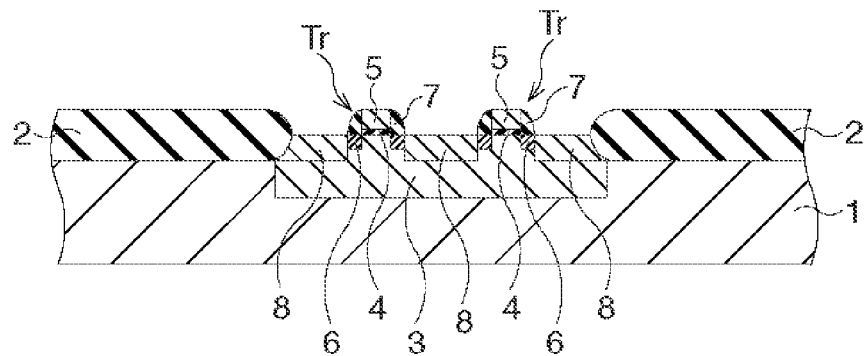
FIG. 1A to FIG. 1J are cross-sectional views showing a manufacturing method of a semiconductor device according to a first embodiment of the present invention in order of steps.

In the first embodiment, as illustrated in FIG. 1A, first, an element isolation insulating film 2 is first formed on a surface of a semiconductor substrate 1 composed of silicon or the like. The element isolation insulating film 2 is formed by, for example, a LOCOS (local oxidation of silicon) method or an STI (shallow trench isolation) method. Next, an ion implantation of P-type impurity (for example, boron) is performed in the surface of an element region demarcated by the element isolation insulating film 2 thereby forming a P-well 3. Next, gate insulating films 4 and gate electrodes 5 are formed on the P-well 3. Thereafter, an ion implantation of N-type impurity (for example, phosphorus) is performed in the surface of the P-well 3 thereby forming shallow impurity diffusion layers 6. Subsequently, sidewall insulating films 7 are formed on lateral sides of the gate electrodes 5. Next, an ion implantation of N-type impurity (for example, arsenic) is performed in the surface of the P-well 3 thereby forming deep impurity diffusion layers 8. Thus, transistors Tr are formed. The channel length of the transistor Tr is not limited in particular, but it is, for example, 360 µm. Further, the gate insulating film 4 is a silicon oxide film whose thickness is, for example, 6 nm to 7 nm, and the gate electrode 5 includes, for example, an amorphous silicon layer whose thickness is approximately 50 nm and a tungsten silicide layer whose thickness is approximately 150 nm formed thereon. Note that the single transistor Tr includes the two impurity diffusion layers 8, and one of them is shared with another transistor Tr. The impurity diffusion layer 8 that is shared constitutes a drain, and the impurity diffusion layer 8 that is not shared constitutes a source.

Figure 1B:
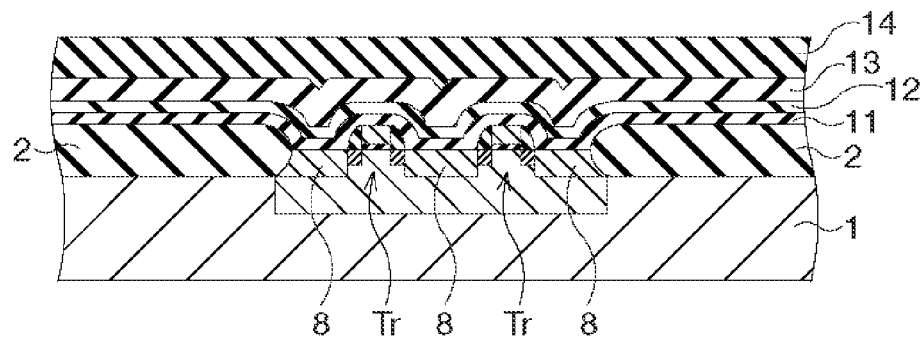

Next, as illustrated in FIG. 1B, a silicon oxynitride film 11 covering the transistors Tr is formed by a plasma CVD method or the like, and a coating solution of spin on glass (SOG) is applied thereon and precured in an inert gas (argon gas, nitrogen gas, or the like) atmosphere. The precure is set such that the temperature is approximately 100° C. to 200° C., preferably approximately 150° C. to 200° C., and the time is for approximately one minute to three minutes. As a result, moisture contained in the coating solution volatilizes, and then, an SOG film 12 is formed. The thickness of the SOG film 12 may be set to be approximately 40 nm. Next, another coating solution of SOG is applied on the SOG film 12 and precured. The precure is set such that the temperature is approximately 300° C. and the time is for approximately two minutes to three minutes. As a result, moisture contained in the coating solution volatilizes, and then, an SOG film 13 is formed. The thickness of the SOG film 13 may be set to be approximately 280 nm. Thereafter, another coating solution of SOG is applied on the SOG film 13 and precured. The precure is set such that the temperature is approximately 300° C. and the time is for approximately two minutes to three minutes. As a result, moisture contained in the coating solution volatilizes, and then, an SOG film 14 is formed. The thickness of the SOG film 14 may be set to be approximately 280 nm. The reason why the precure is performed in inert gas is that a problem in curing a coating solution of SOG may be caused in the case when the precure is performed in activated gas. Subsequently, a main cure of the SOG films 12, 13, and 14 is performed. The main cure is set such that the temperature is approximately 450° C. and the time is for approximately 30 minutes. Further, into a furnace, $O_2$ gas is supplied by at a flow rate of 15 l(liter)/minute, and $H_2O$ gas is supplied at a flow rate of 0.06 ml/minute.

Note that a viscosity of the coating solution of SOG used for forming the SOG film 12 is lower than those of the coating solutions of SOG used for forming the SOG films 13 and 14. Further, the viscosity of the coating solution of SOG used for forming the SOG film 12 is preferable a viscosity in which a coating film whose thickness is 10 nm to 50 nm can be obtained in the case when the coating solution is supplied to a coater while spinning this coater at a speed of 2000 rpm to 4000 rpm. Further, it is preferable that, in forming the SOG films 13 and 14, the coating solutions having the same viscosity are used, but the coating solutions having different viscosities may be used. The reason why the SOG films are formed in two divided processes by using the coating solutions having the same viscosity is that it is experientially found that cost is reduced thereby. Accordingly, if importance is placed on time or the like rather than cost, the SOG films may be formed as the single SOG film without separating the SOG films 13 and 14. In this embodiment, a first coating-type insulating film includes the SOG film 12, and a second coating-type insulating film includes the SOG films 13 and 14. Accordingly, in the case when the coating solutions having different viscosities are used in forming the SOG films 13 and 14, two types of coating solutions are to be used as a second coating solution.

Note that it is preferable that the thickness of the SOG film 12 is equal to or less than 50 nm. This is because it is difficult to form an SOG film whose thickness exceeds 50 nm by using a coating solution whose viscosity is low.

Figure 1C:
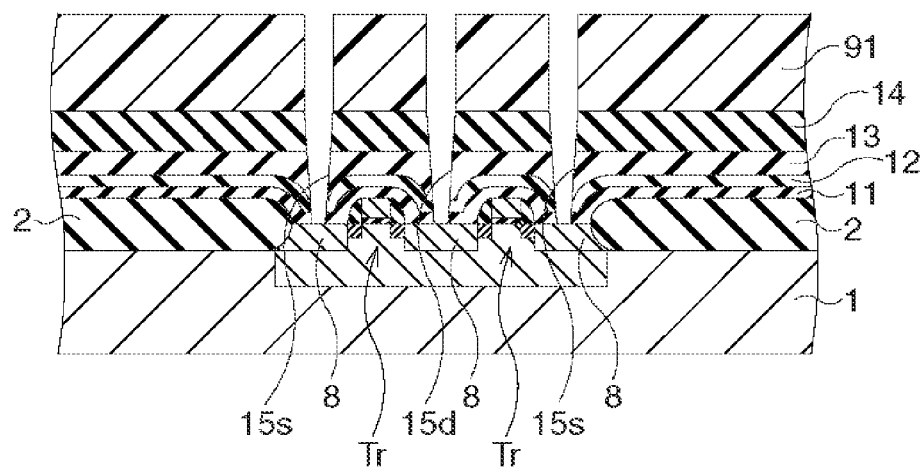

After the main cure, as illustrated in FIG. 1C, a resist pattern 91 having openings at positions matching the impurity diffusion layers 8 is formed on the SOG film 14. Then, etching of the SOG film 14 and so on is performed by using the resist pattern 91 as a mask thereby forming contact holes 15*s* reaching the sources and a contact hole 15*d* reaching the drain.

Figure 1D:
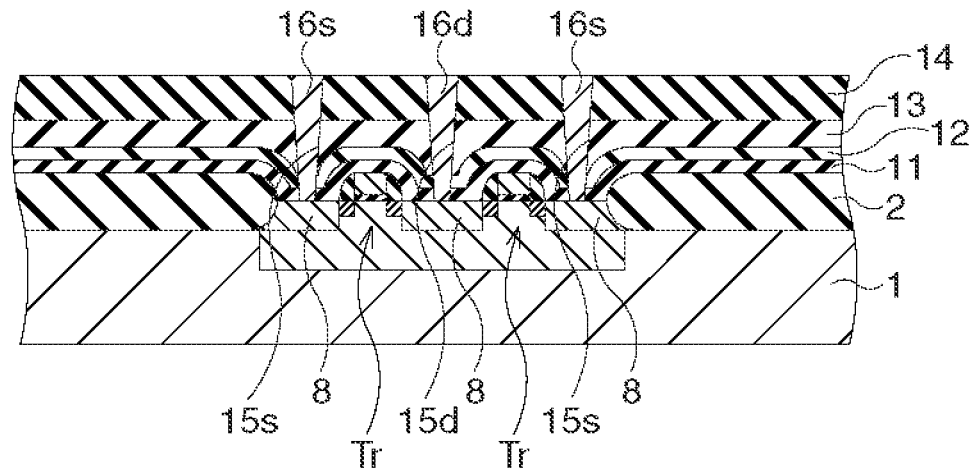

Next, as illustrated in FIG. 1D, the resist pattern 91 is removed. Next, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the SOG film 14 is exposed. As a result, contact plugs 16*s* are formed in the contact holes 15*s*, and a contact plug 16*d* is formed in the contact hole 15*d*.

Figure 1E:
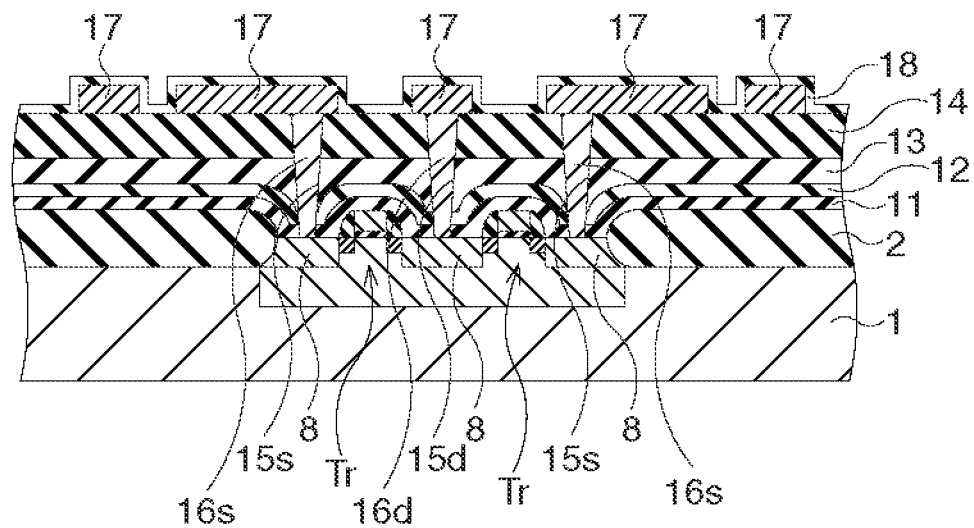

Thereafter, as illustrated in FIG. 1E, wirings 17 in contact with the contact plugs 16*s* and 16*d* are formed. Note that, in forming the wirings 17, first, a titanium nitride film whose thickness is approximately 150 nm, an AlCu alloy film whose thickness is approximately 550 nm, a titanium film whose thickness is approximately 5 nm, and a titanium nitride film whose thickness is approximately 150 nm are sequentially formed by a PVD method or the like. Next, patterning of these films is performed.

After forming the wirings 17, a heat treatment in which a vertical furnace is used, the temperature of the semiconductor substrate 1 is 350° C., the treatment time is for 30 minutes, and the supply amount of nitrogen gas is 20 l(liter)/minute is performed. Next, as illustrated in FIG. 1E, a silicon oxynitride film 18 is formed on the entire surface by a plasma CVD method or the like.

Figure 1F:
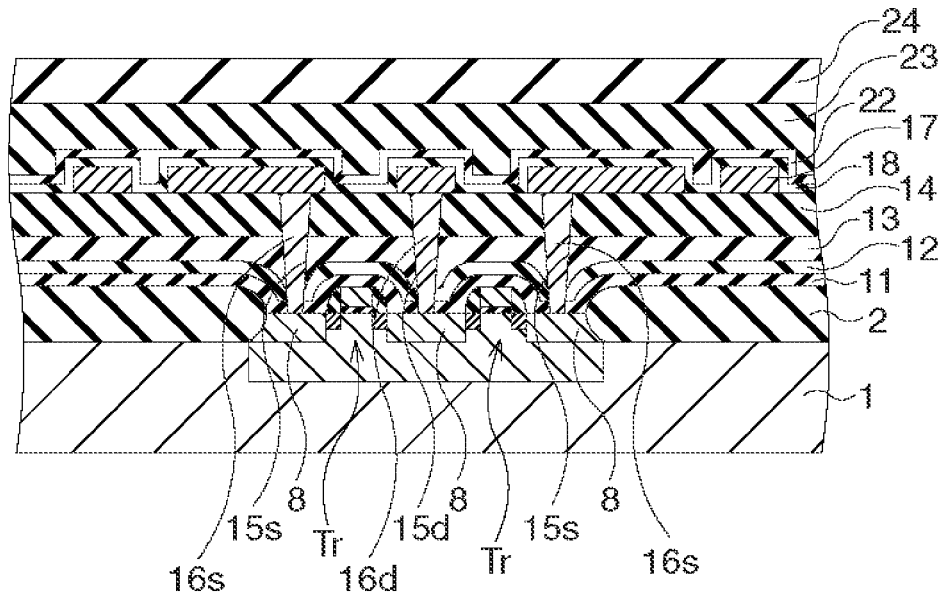

Thereafter, as illustrated in FIG. 1F, another coating solution of SOG is applied on the silicon oxynitride film 18 and precured. The precure is set such that the temperature is approximately 100° C. to 200° C., and the time is for approximately two minutes to three minutes. As a result, moisture contained in the coating solution volatilizes, and then, an SOG film 22 is formed. The thickness of the SOG film 22 may be set to be approximately 40 nm. Next, another coating solution of SOG is applied on the SOG film 22 and precured. The precure is set such that the temperature is approximately 300° C. and the time is for approximately two minutes to three minutes. As a result, moisture contained in the coating solution volatilizes, and then, an SOG film 23 is formed. The thickness of the SOG film 23 may be set to be approximately 280 nm. Thereafter, another coating solution of SOG is applied on the SOG film 23 and precured. The precure is set such that the temperature is approximately 300° C. and the time is for approximately two minutes to three minutes. As a result, moisture contained in the coating solution volatilizes, and then, an SOG film 24 is formed. The thickness of the SOG film 24 is set to be approximately 280 nm. Subsequently, a main cure of the SOG films 22, 23, and 24 is performed. The main cure is set such that the temperature is approximately 450° C. and the time is for approximately 30 minutes. Further, into a furnace, $O_2$ gas is supplied at a flow rate of 15 l/minute, and $H_2O$ gas is supplied at a flow rate of 0.06 ml/minute.

Note that a viscosity of the coating solution of SOG used for forming the SOG film 22 is lower than those of the coating solutions of SOG used for forming the SOG films 23 and 24. Further, the viscosity of the coating solution of SOG used for forming the SOG film 22 is preferable a viscosity in which a coating film whose thickness is 10 nm to 50 nm can be obtained in the case when the coating solution is supplied to a coater while spinning this coater at a speed of 2000 rpm to 4000 rpm. Further, it is preferable that, in forming the SOG films 23 and 24, the coating solutions having the same viscosity are used, but the coating solutions having different viscosities may be used. The reason why the SOG films are formed in two divided processes by using the coating solutions having the same viscosity is that it is experientially found that cost is reduced thereby. Accordingly, if importance is placed on time or the like rather than cost, the SOG films may be formed as the single SOG film without separating the SOG films 23 and 24. In this embodiment, another first coating-type insulating film includes the SOG film 22, and another second coating-type insulating film includes the SOG films 23 and 24. Accordingly, in the case when the coating solutions having different viscosities are used in forming the SOG films 23 and 24, two types of coating solutions are to be used as another second coating solution.

Note that it is also preferable that the thickness of the SOG film 22 is set to be equal to or less than 50 nm. This is because it is difficult to form an SOG film whose thickness exceeds 50 nm by using a coating solution whose viscosity is low.

Figure 1G:
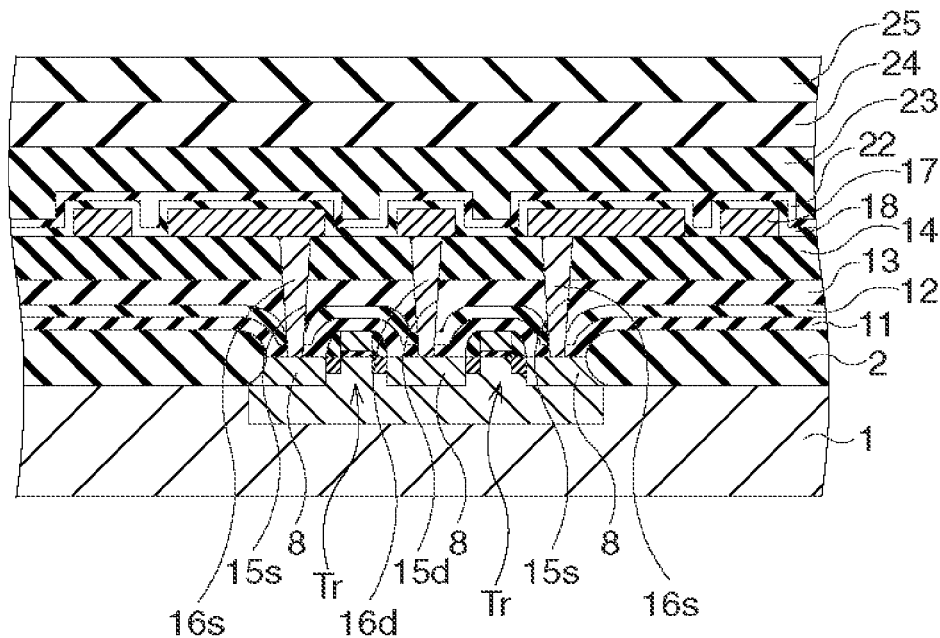

Next, as illustrated in FIG. 1G, an NSG (non-doped silicate glass) film (a silicon oxide film) 25 is formed by a plasma CVD method using TEOS or the like. The thickness of the NSG film 25 may be set to be approximately 200 nm.

Figure 1H:
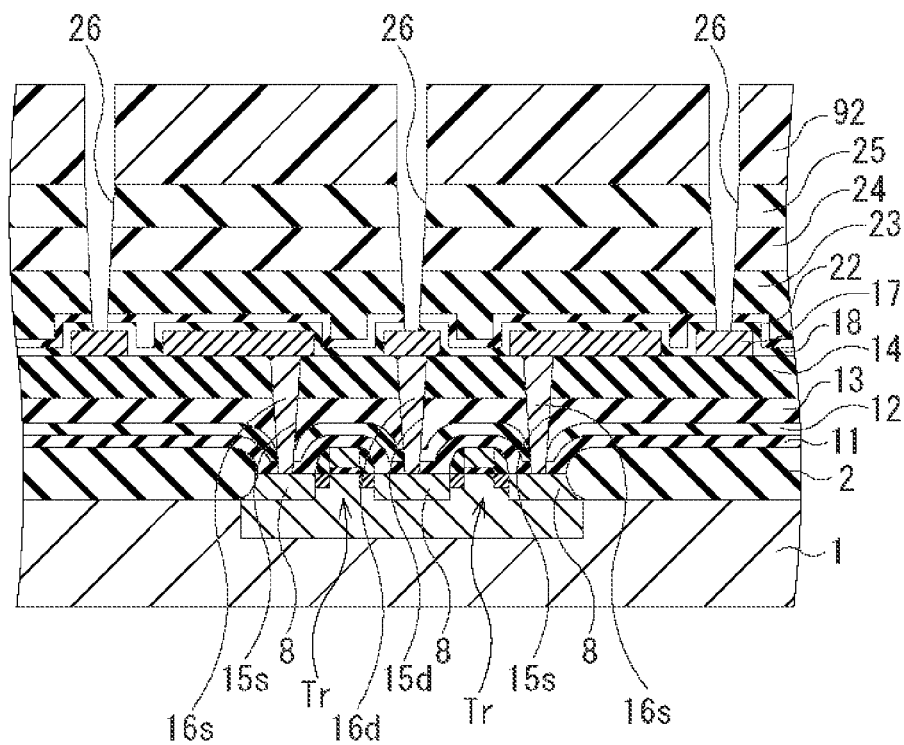

Next, as illustrated in FIG. 1H, a resist pattern 92 having openings at positions matching the wirings 17 is formed on the NSG film 25. Then, etching of the NSG film 25 and so on is performed by using the resist pattern 92 as a mask thereby forming contact holes 26 reaching the wirings 17.

Figure 1I:
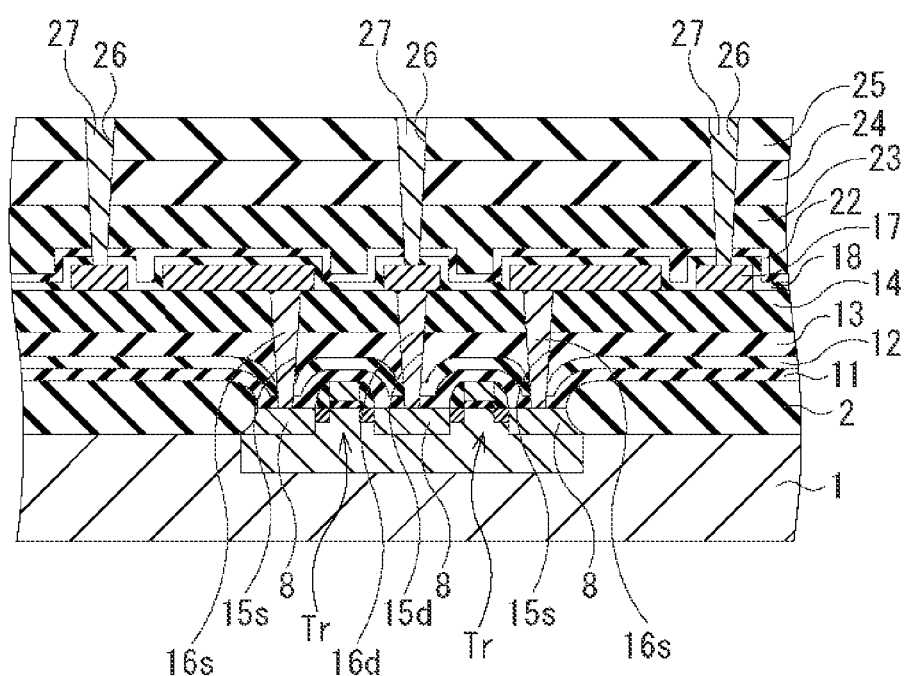

Thereafter, as illustrated in FIG. 1I, the resist pattern 92 is removed. Next, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the NSG film 25 is exposed. As a result, contact plugs 27 are formed in the contact holes 26.

Figure 1J:
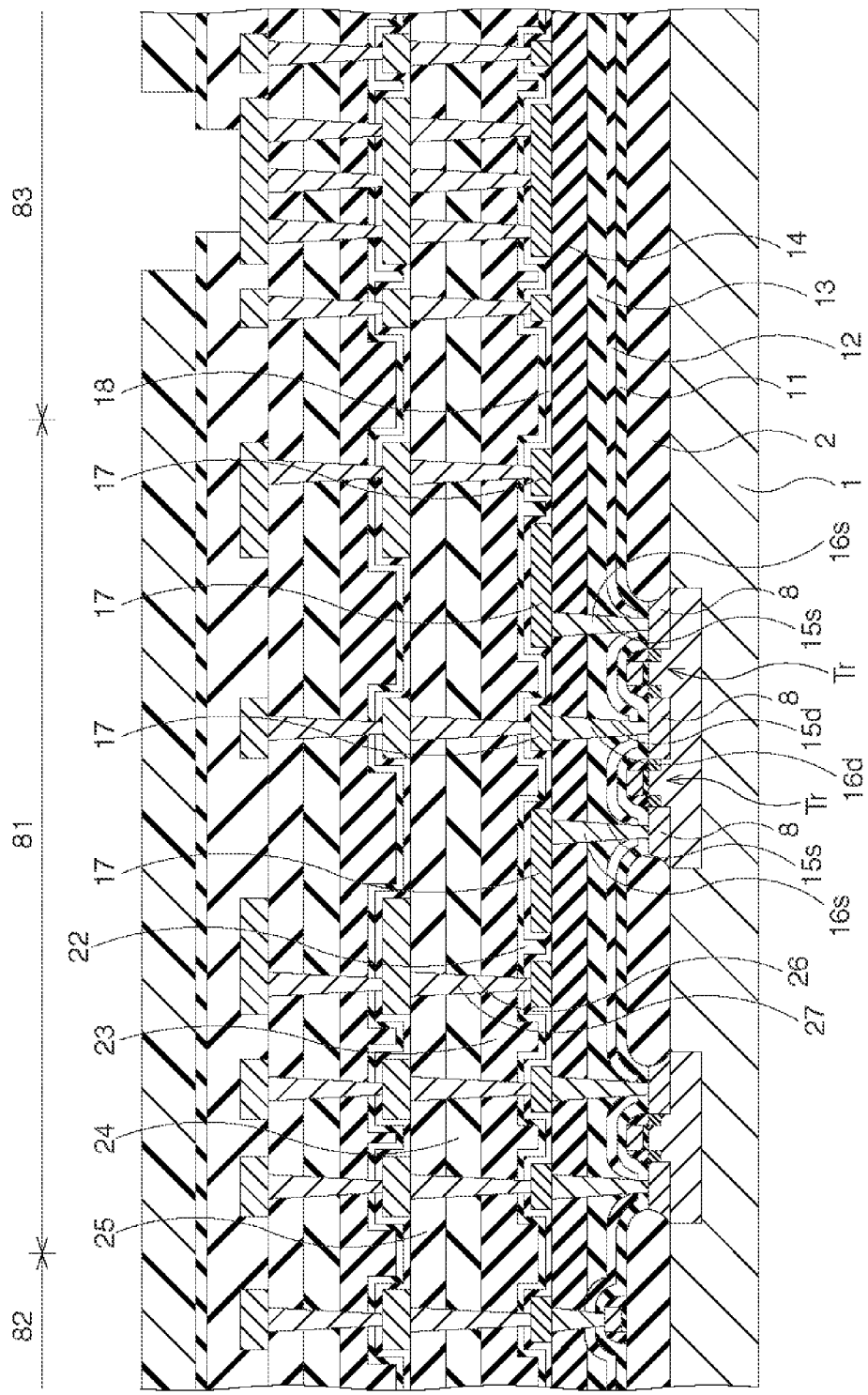

Thereafter, as illustrated in FIG. 1J, upper layer wirings and so on are formed. Although illustration in FIG. 1A to FIG. 1I is omitted, forming the transistor, the wiring, and so on is performed not only in a logic circuit portion 81, but also in a peripheral circuit portion 82 and a pad portion 83.

In this first embodiment, before forming the SOG films 13 and 14, the SOG film 12 is formed by using the coating solution whose viscosity is lower than those of the coating solutions used for forming the SOG films 13 and 14, and before forming the SOG films 23 and 24, the SOG film 22 is formed by using the coating solution whose viscosity is lower than those of the coating solutions used for forming the SOG films 23 and 24. Therefore, a void between the silicon oxynitride film and the SOG film is hardly caused. Thus, according to this embodiment, a rise of contact resistance, occurrence of a crack and the like can be suppressed. Further, the SOG film is a coating-type oxide film, so that flattening the surface thereof is not needed. Consequently, it becomes possible to avoid increases of time, cost and the like due to flattening.

Figure 2:
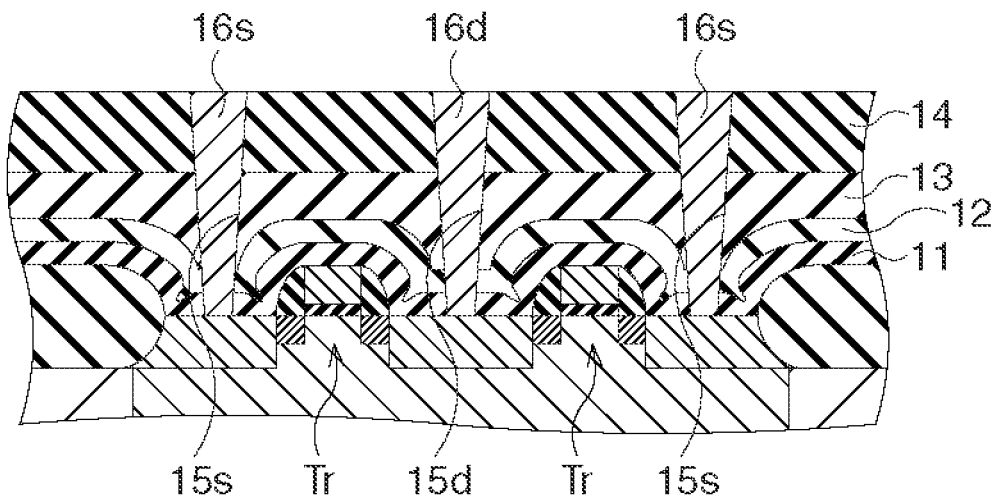
FIG. 2 is a cross-sectional view showing SOG films 12, 13, and 14.
Figure 3:
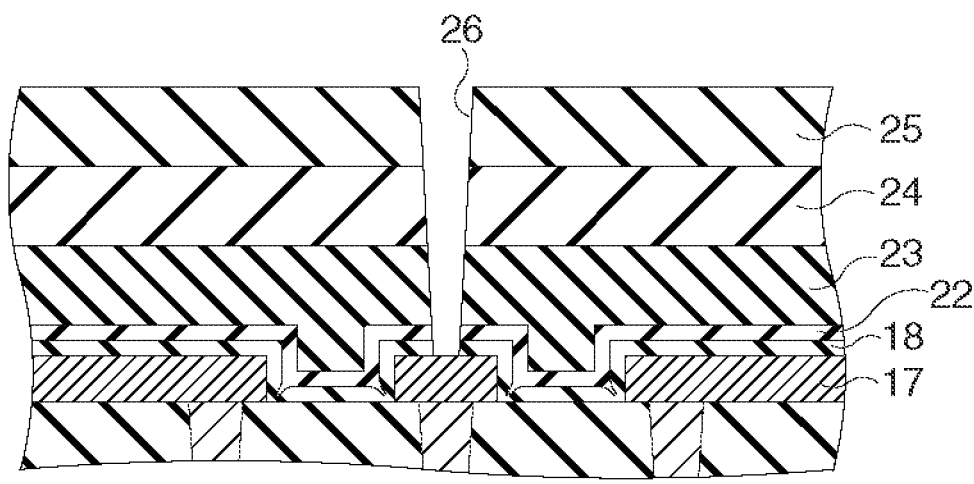
FIG. 3 is a cross-sectional view showing SOG films 22, 23, and 24.

For example, as illustrated in FIG. 2, the SOG film 12 gets contact with the silicon oxynitride film 11. Therefore, deformations of the contact plugs 16s and 16d are hardly caused. Further, as illustrated in FIG. 3, the SOG film 22 gets contact with the silicon oxynitride film 18. Therefore, a crack is hardly caused, and a rise of contact resistance is hardly caused.

Second Embodiment

Figure 4A:
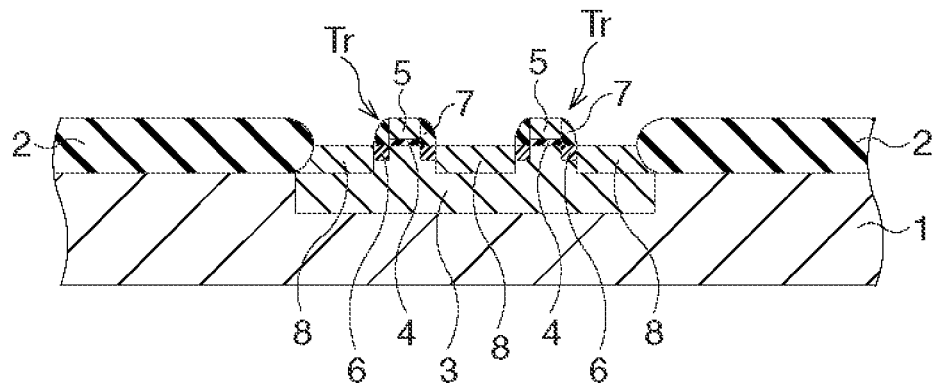
FIG. 4A to FIG. 4C are cross-sectional views showing a manufacturing method of a semiconductor device according to a second embodiment of the present invention in order of steps.
Figure 4B:
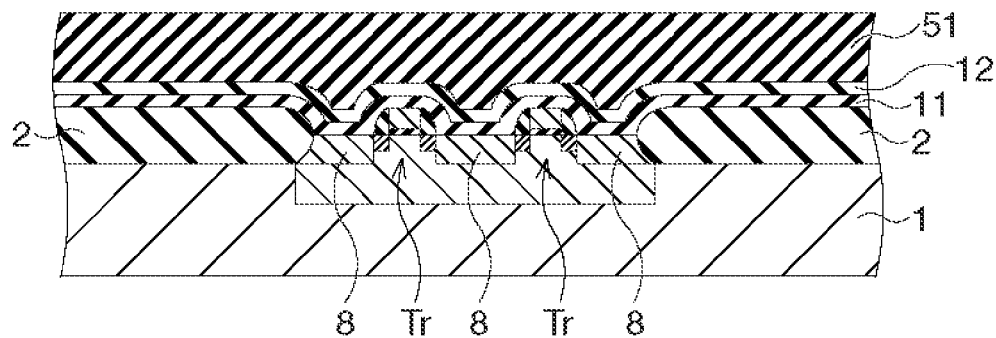
Figure 4C:
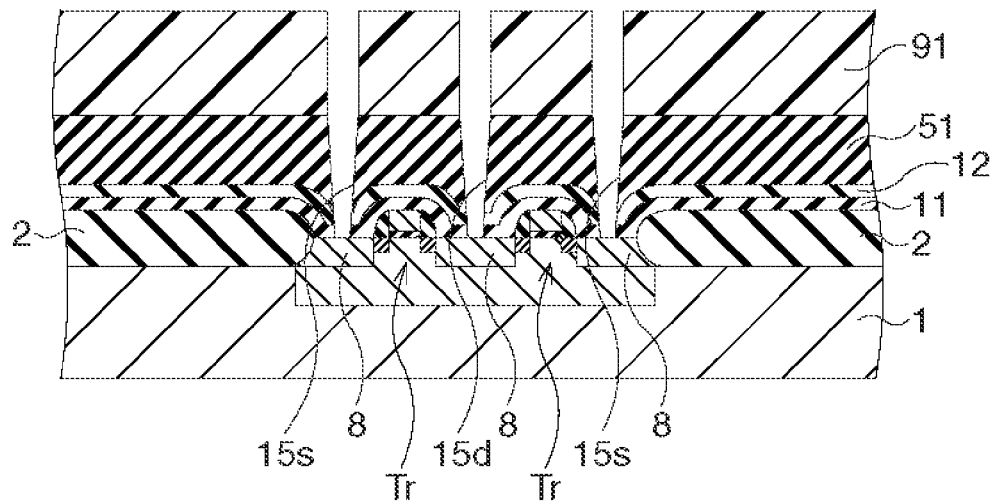

Next, a second embodiment of the present invention will be explained. FIG. 4A to FIG. 4C are cross-sectional views showing a manufacturing method of a semiconductor device according to the second embodiment of the present invention in order of steps.

In the second embodiment, first, similarly to the first embodiment, as illustrated in FIG. 4A, the processes to the formation of the transistors Tr are performed.

Next, as illustrated in FIG. 4B, the silicon oxynitride film 11 covering the transistors Tr is formed by a plasma CVD method or the like, and a coating solution of SOG is applied thereon and precured. The precure is set such that the temperature is approximately 100° C. to 200° C. and the time is for approximately two minutes to three minutes. As a result, the SOG film 12 is formed. The thickness of the SOG film 12 may be set to be approximately 40 nm. Next, a main cure of the SOG film 12 is performed. The main cure is set such that the temperature is approximately 450° C. and the time is for approximately 30 minutes. Further, into a furnace, $O_2$ gas is supplied at a flow rate of 15 l/minute, and $H_2O$ gas is supplied at a flow rate of 0.06 ml/minute. Thereafter, an NSG film 51 is formed on the SOG film 12 by a plasma CVD method using TEOS or the like. The thickness of the NSG film 51 may be set to be approximately 600 nm. Next, the surface of the NSG film 51 is polished for approximately 200 nm to be flattened.

Thereafter, as illustrated in FIG. 4C, the resist pattern 91 having openings at positions matching the impurity diffusion layers 8 is formed on the NSG film 51. Then, etching of the NSG film 51 and so on is performed by using the resist pattern 91 as a mask thereby forming the contact holes 15s reaching the sources and the contact hole 15d reaching the drain.

Thereafter, similarly to the first embodiment, the processes from the removal of the resist pattern 91 are performed.

In this second embodiment, the SOG film 12 is formed before forming the NSG film 51. Therefore, similarly to the first embodiment, a rise of contact resistance, occurrence of a crack and the like can be suppressed. Further, forming and flattening of the NSG film 51 are performed, and therefore, a flatter interlayer insulating film can be obtained even though there exists a possibility to increase time and cost compared with the first embodiment.

Third Embodiment

Figure 5A:
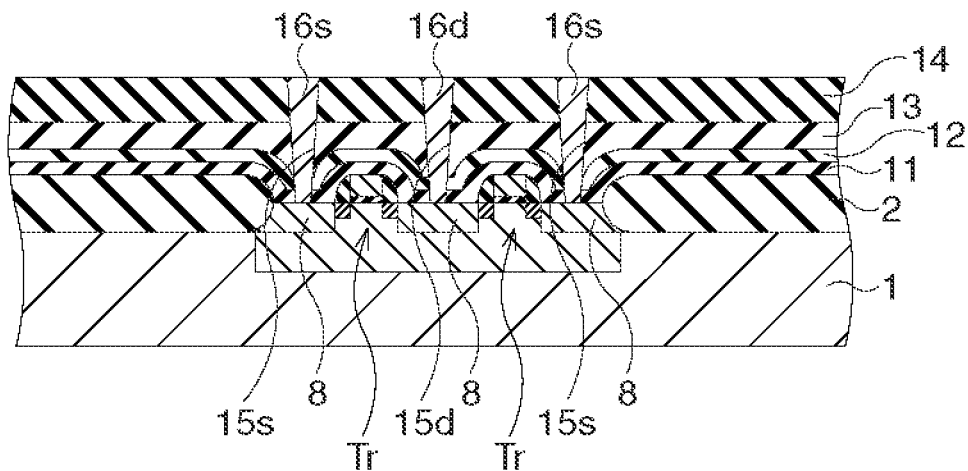
FIG. 5A and FIG. 5B are cross-sectional views showing a manufacturing method of a semiconductor device according to a third embodiment of the present invention in order of steps.
Figure 5B:
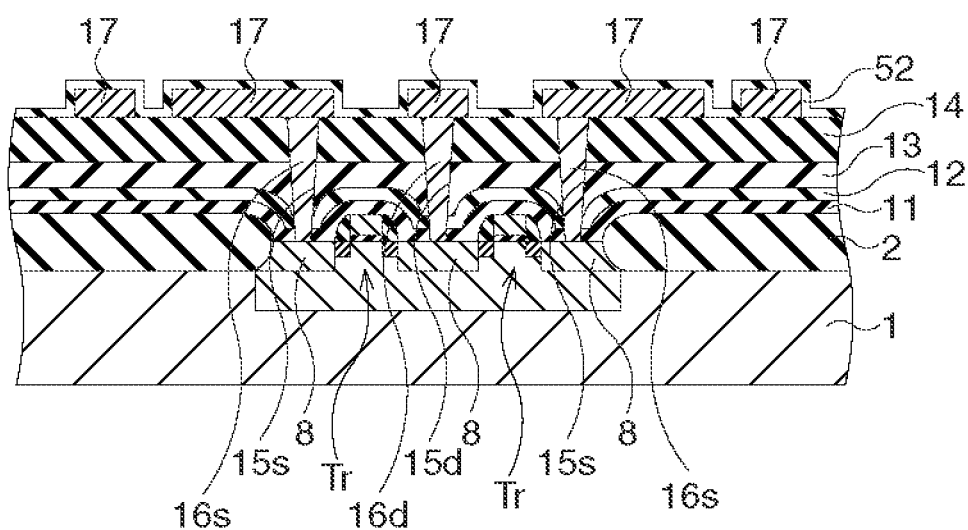

Next, a third embodiment of the present invention will be explained. FIG. 5A and FIG. 5B are cross-sectional views showing a manufacturing method of a semiconductor device according to the third embodiment of the present invention in order of steps.

In the third embodiment, firstly, similarly to the first embodiment, as illustrated in FIG. 5A, the processes to the formation of the contact plugs 16s and 16d are performed.

Next, as illustrated in FIG. 5B, the wirings 17 in contact with the contact plugs 16s and 16d are formed. Note that, in forming the wirings 17, first, a titanium nitride film whose thickness is approximately 150 nm, an AlCu alloy film whose thickness is approximately 550 nm, a titanium film whose thickness is approximately 5 nm, and a titanium nitride film whose thickness is approximately 150 nm are sequentially formed by a PVD method or the like. Next, patterning of these films is performed.

After forming the wirings 17, a heat treatment in which a vertical furnace is used, the temperature of the semiconductor substrate 1 is 350° C., the treatment time is for 30 minutes, and the supply amount of nitrogen gas is 20 l/minute is performed. Next, as illustrated in FIG. 5B, an NSG film (a silicon oxide film) 52 is formed on the entire surface by a plasma CVD method using TEOS or the like. The thickness of the NSG film 52 may be set to be approximately 300 nm.

Thereafter, similarly to the first embodiment, the processes from the formation of the SOG film 22 are performed.

According to this third embodiment as well, the same effect as that of the first embodiment can be obtained.

Fourth Embodiment

Next, a fourth embodiment of the present invention will be explained. FIG. 6A to FIG. 6E are cross-sectional views showing a manufacturing method of a semiconductor device according to the fourth embodiment of the present invention in order of steps.

Figure 6A:
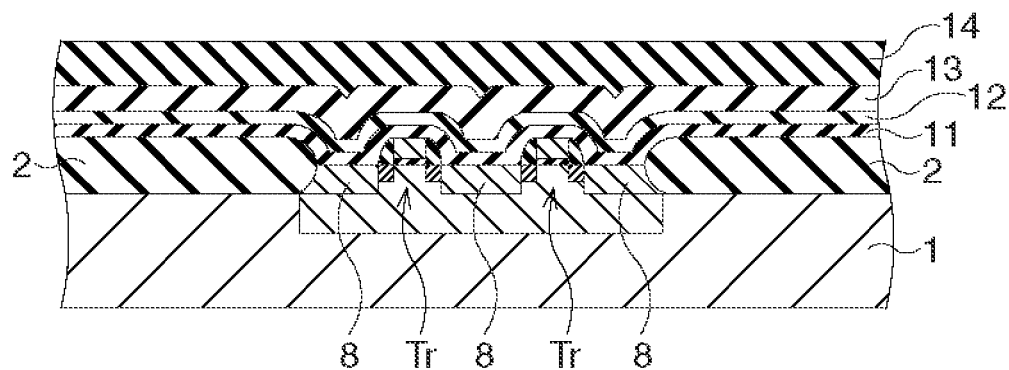
FIG. 6A to FIG. 6E are cross-sectional views showing a manufacturing method of a semiconductor device according to a fourth embodiment of the present invention in order of steps.

In the fourth embodiment, first, similarly to the first embodiment, as illustrated in FIG. 6A, the processes to the main cure of the SOG films 12, 13, and 14 are performed.

Figure 6B:
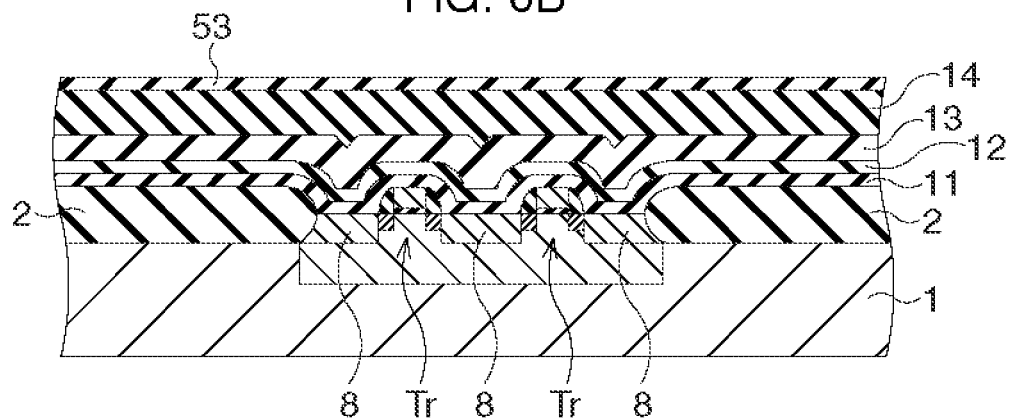
Figure 6C:
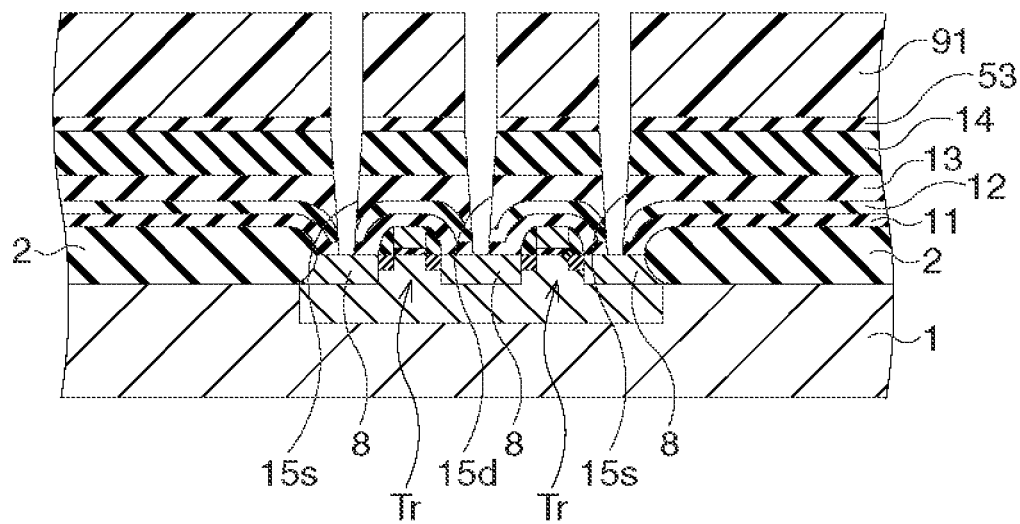

Next, as illustrated in FIG. 6B, an aluminum oxide film 53 whose thickness is approximately 20 nm is formed on the SOG film 14 by a PVD method or the like.

Next, the resist pattern 91 having openings at positions matching the impurity diffusion layers 8 is formed on the aluminum oxide film 53. Then, etching of the aluminum oxide film 53 and so on is performed by using the resist pattern 91 as a mask thereby forming the contact holes 15s reaching the sources and the contact hole 15d reaching the drain.

Figure 6D:
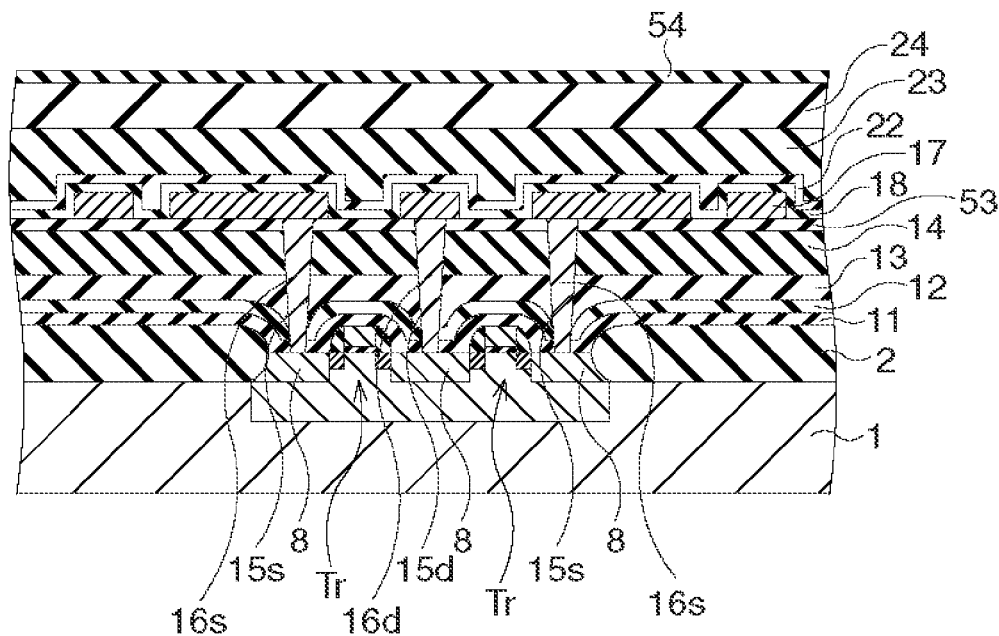

Thereafter, as illustrated in FIG. 6D, similarly to the first embodiment, the processes from the removal of the resist pattern 91 to the main cure of the SOG film 24 are performed. Subsequently, an aluminum oxide film 54 whose thickness is approximately 20 nm is formed on the SOG film 24 by a PVD method or the like.

Figure 6E:
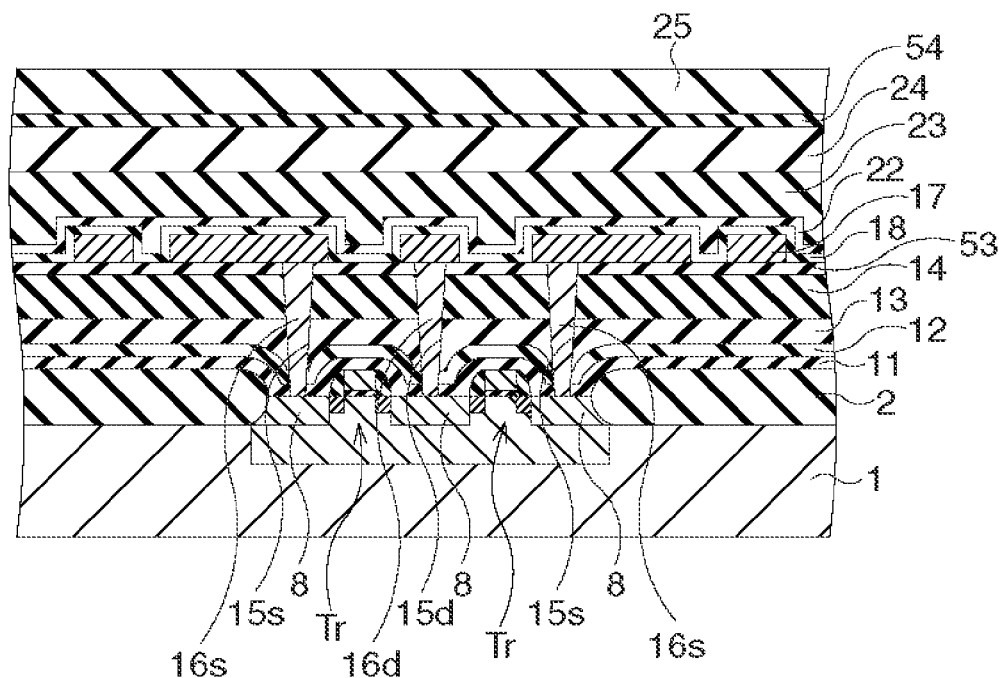

Next, as illustrated in FIG. 6E, the NSG film 25 is formed on the aluminum oxide film 54 by a plasma CVD method using TEOS or the like. The thickness of the NSG film 25 may be set to be approximately 100 nm.

Thereafter, similarly to the first embodiment, the processes from the formation of the resist pattern 92 are performed.

According to this fourth embodiment as well, the same effect as that of the first embodiment can be obtained. Further, diffusion of moisture and hydrogen into the transistor Tr and so on can be suppressed by the aluminum oxide film 53. Further, in forming the NSG film 25, the SOG films 23 and 24 are covered with the aluminum oxide film 54, so that moisture hardly penetrates into the SOG films 23 and 24. Thus, thereafter, moisture is hardly discharged, resulting that deformation of the contact plug 27 is hardly caused.

Note that one of the aluminum oxide films 53 and 54 may be omitted. Further, it is preferable that the thicknesses of these films are set to be equal to or less than 20 nm. This is because there is a possibility that a process thereof will be difficult to be performed if the thicknesses of these films exceed 20 nm. Further, the aluminum oxide film 54 may be formed on the NSG film 25.

Fifth Embodiment

Figure 7A:
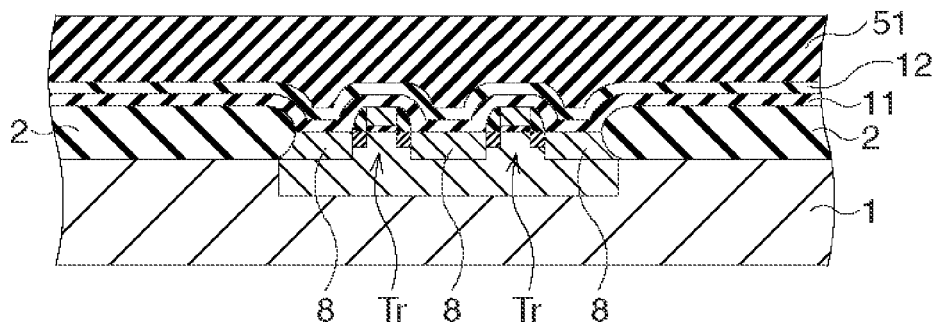
FIG. 7A to FIG. 7C are cross-sectional views showing a manufacturing method of a semiconductor device according to a fifth embodiment of the present invention in order of steps.
Figure 7B:
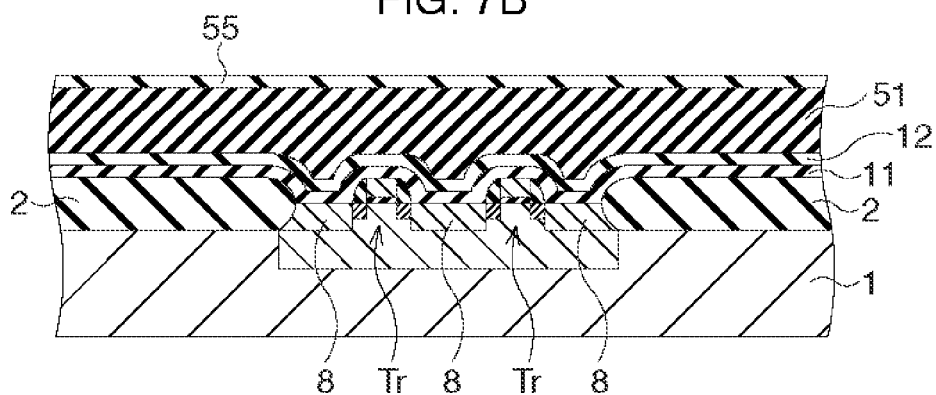
Figure 7C:
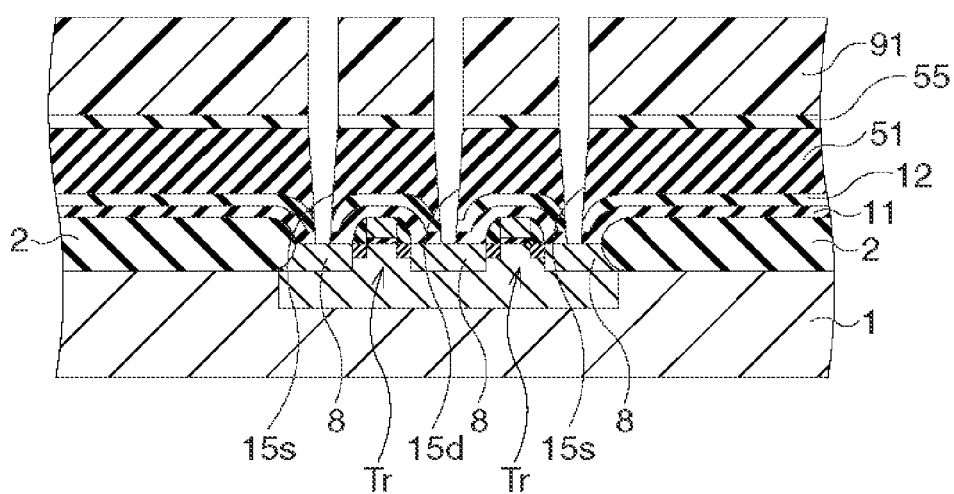

Next, a fifth embodiment of the present invention will be explained. FIG. 7A to FIG. 7C are cross-sectional views showing a manufacturing method of a semiconductor device according to the fifth embodiment of the present invention in order of steps.

In the fifth embodiment, first, similarly to the second embodiment, as illustrated in FIG. 7A, the processes to forming and flattening of the NSG film 51 are performed.

Next, as illustrated in FIG. 7B, an aluminum oxide film 55 whose thickness is approximately 20 nm is formed on the NSG film 51 by a PVD method or the like.

Next, as illustrated in FIG. 7C, the resist pattern 91 having openings at positions matching the impurity diffusion layers 8 is formed on the aluminum oxide film 55. Then, etching of the aluminum oxide film 55 and so on is performed by using the resist pattern 91 as a mask thereby forming the contact holes 15s reaching the sources and the contact hole 15d reaching the drain.

Thereafter, similarly to the fourth embodiment, the processes from the removal of the resist pattern 91 are performed.

According to this fifth embodiment, the same effect as those of the second embodiment and the fourth embodiment can be obtained.

Sixth Embodiment

Figure 8A:
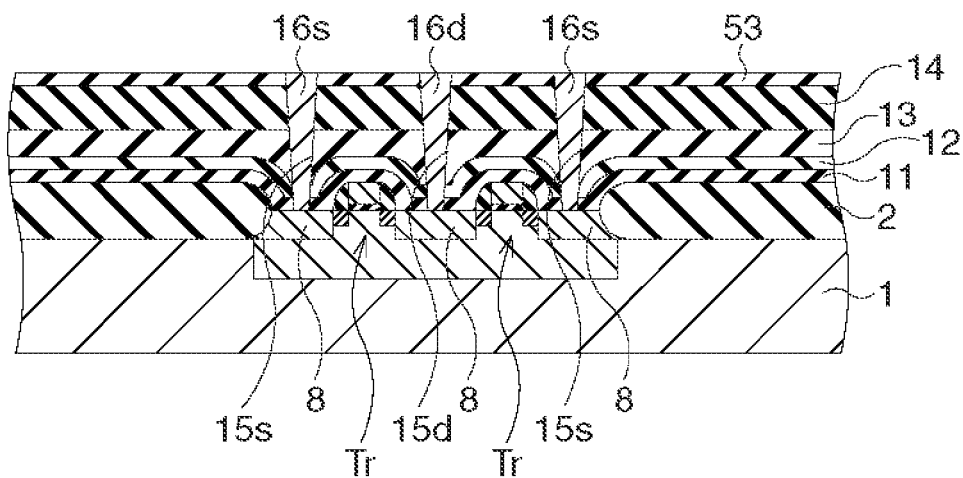
FIG. 8A and FIG. 8B are cross-sectional views showing a manufacturing method of a semiconductor device according to a sixth embodiment of the present invention in order of steps.
Figure 8B:
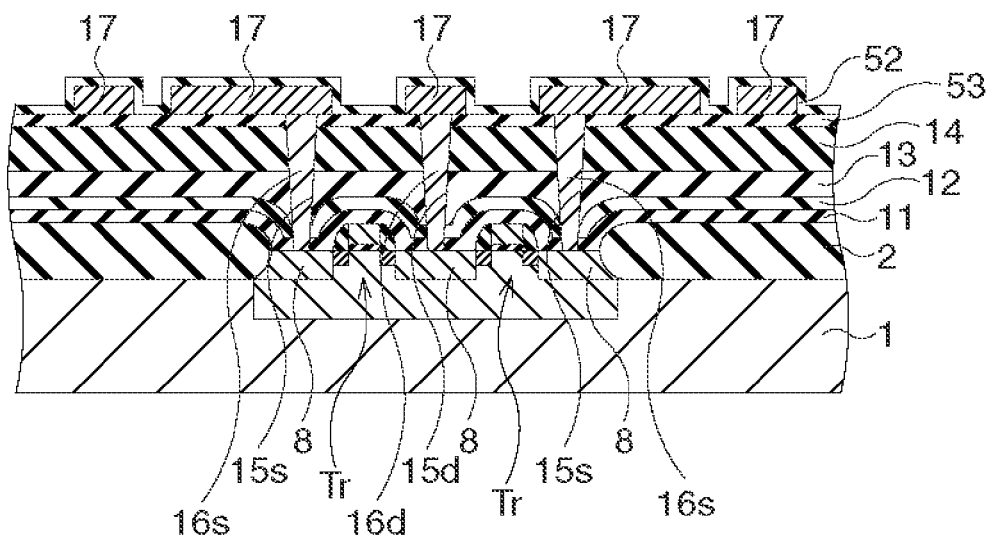
Figure 9A:
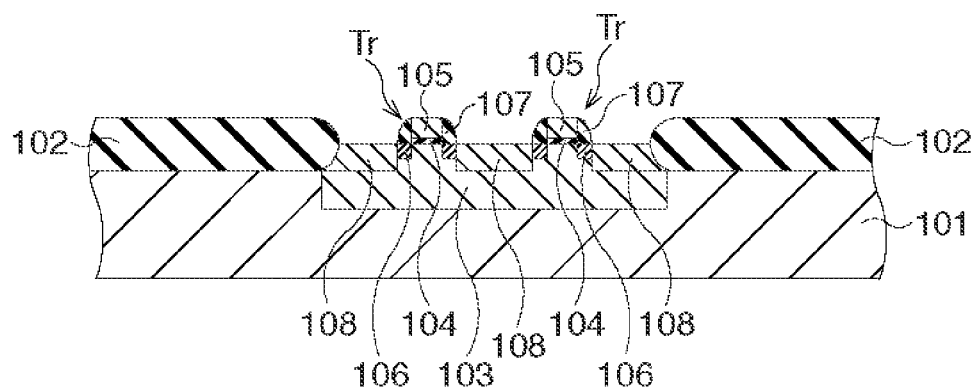
FIG. 9A to FIG. 9G are cross-sectional views showing a conventional manufacturing method of a semiconductor device in order of steps.
Figure 9B:
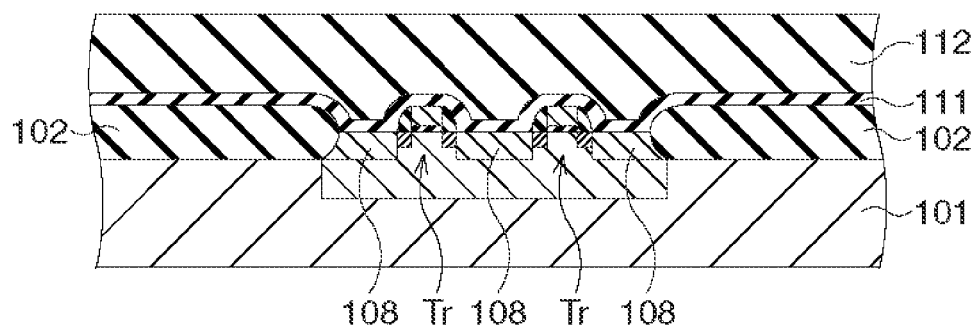
Figure 9C:
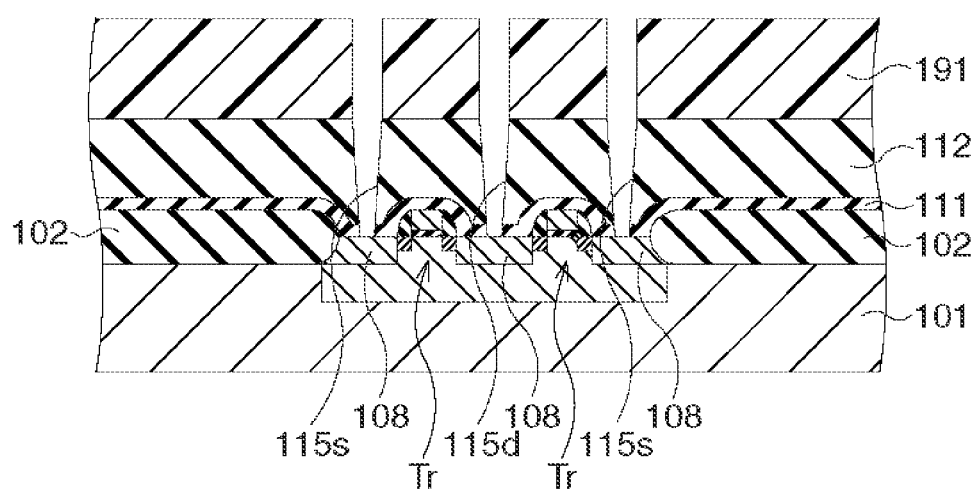
Figure 9D:
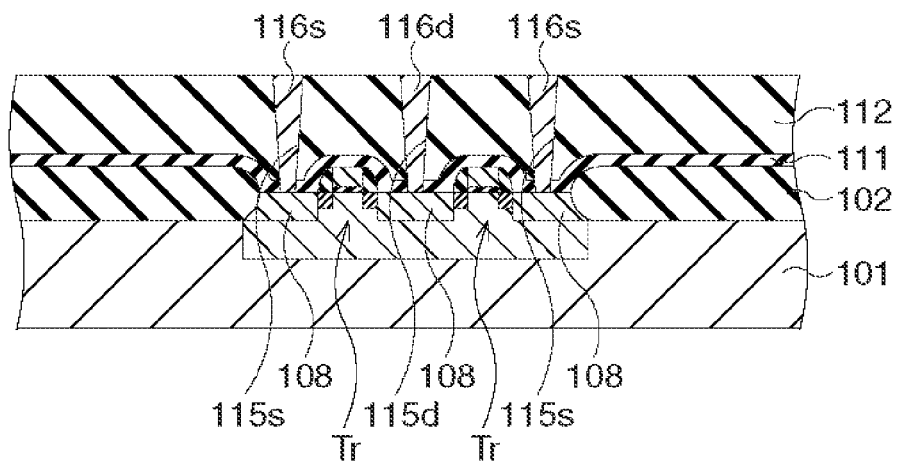
Figure 9E:
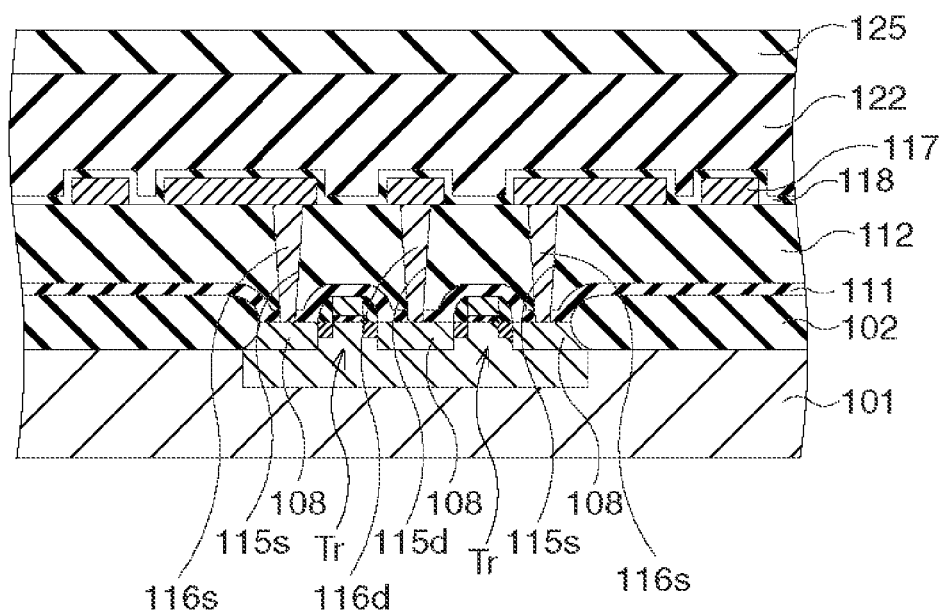
Figure 9F:
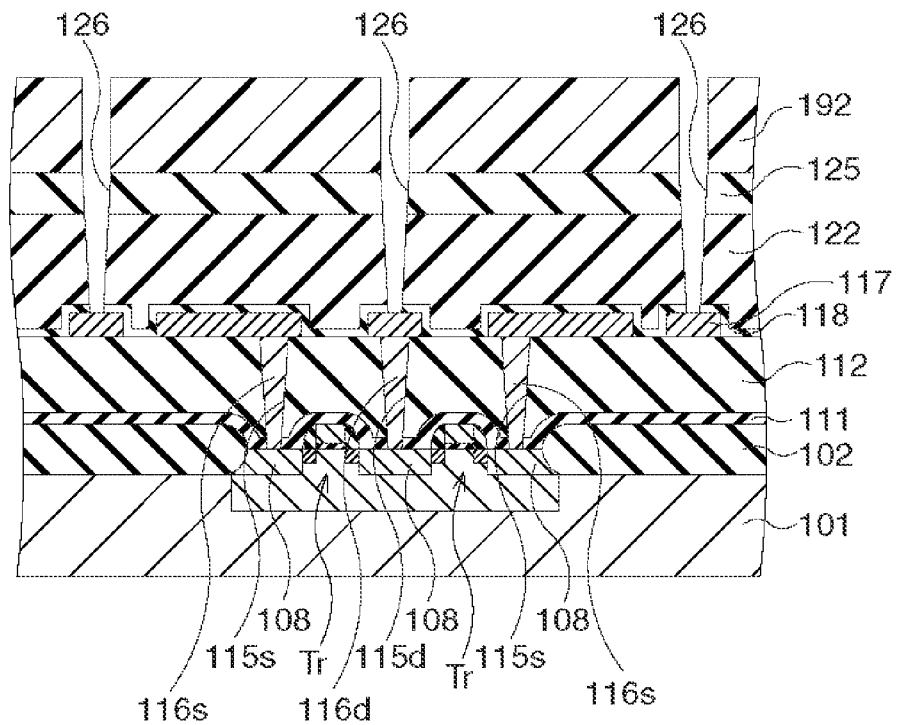
Figure 9G:
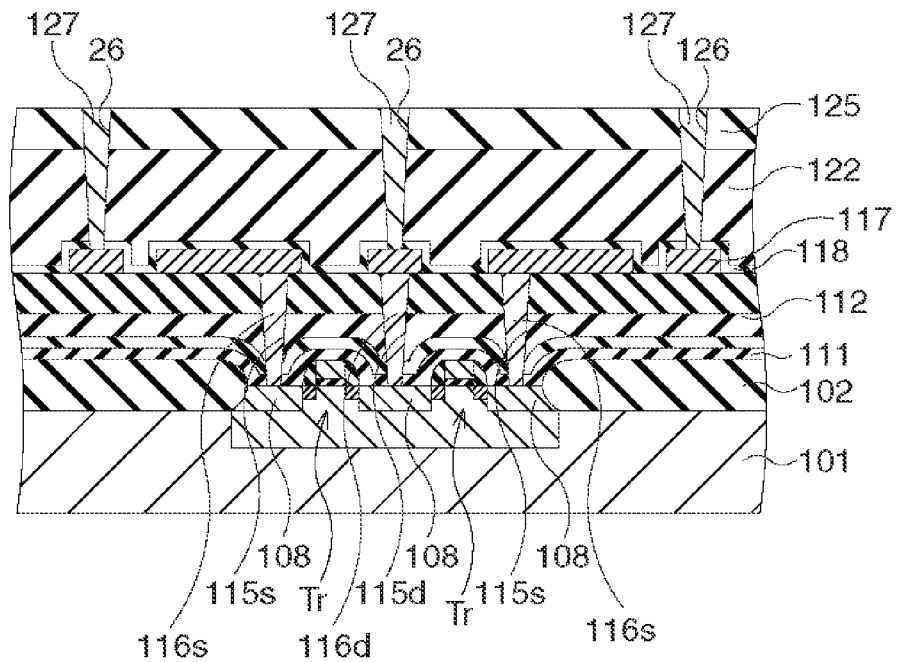
Figure 10A:
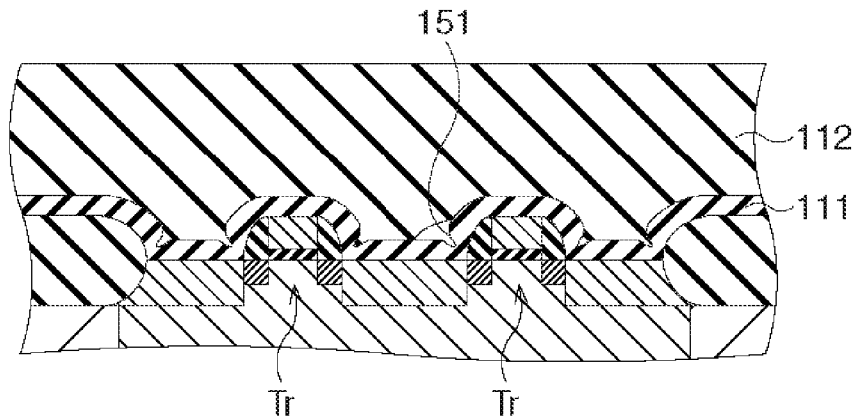
FIG. 10A to FIG. 10C are cross-sectional views showing a problem in the conventional manufacturing method in order of steps.
Figure 10B:
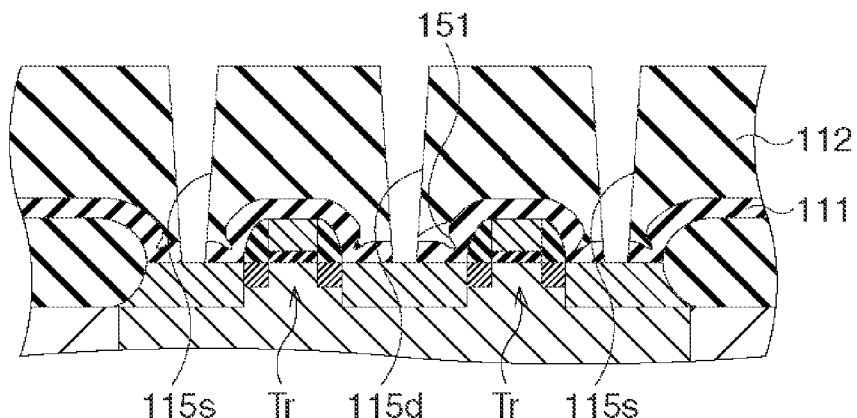
Figure 10C:
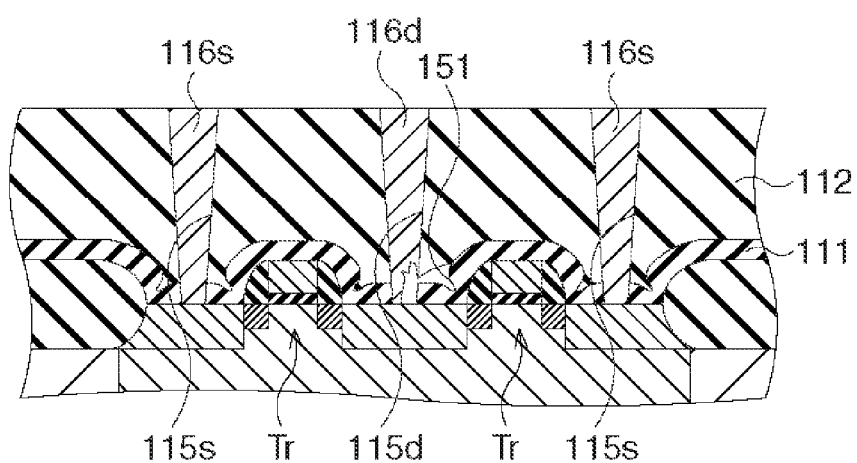
Figure 11A:
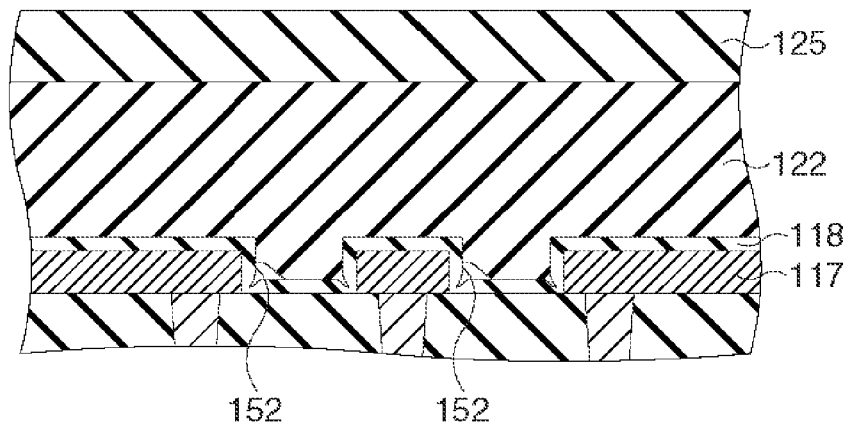
FIG. 11A to FIG. 11C are cross-sectional views showing another problem in the conventional manufacturing method in order of steps.
Figure 11B:
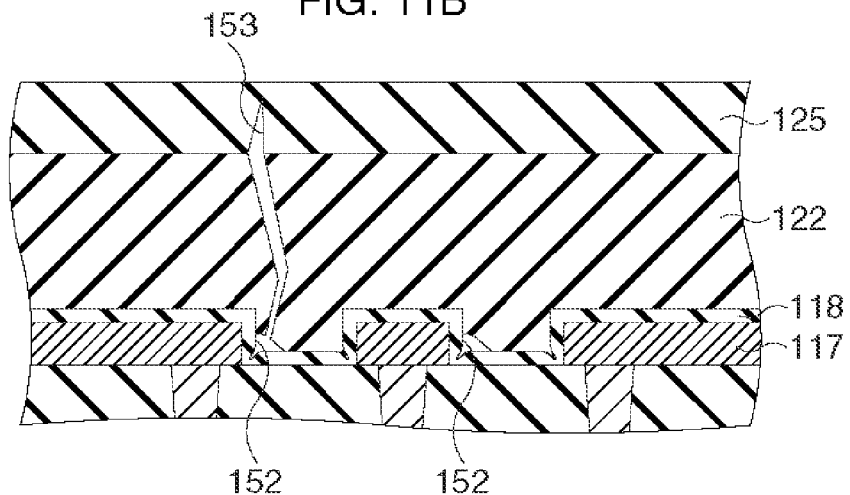
Figure 11C:
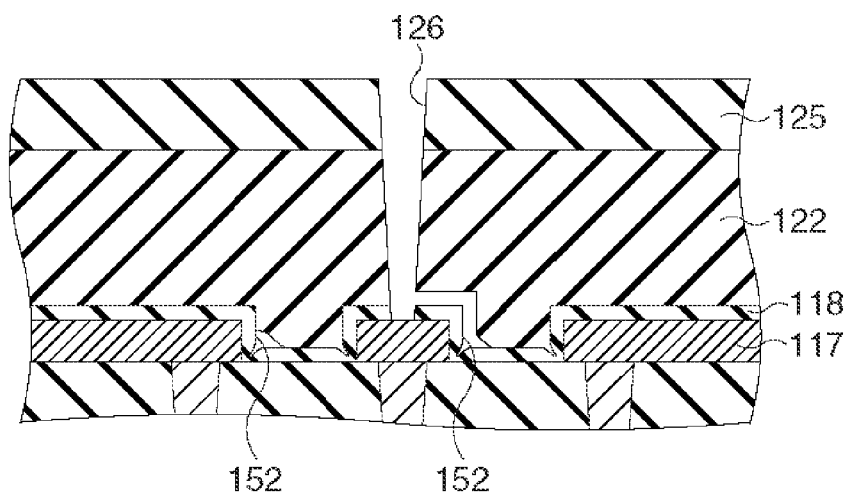

Next, a sixth embodiment of the present invention will be explained. FIG. 8A and FIG. 8B are cross-sectional views showing a manufacturing method of a semiconductor device according to the sixth embodiment of the present invention in order of steps.

In the sixth embodiment, firstly, similarly to the fourth embodiment, as illustrated in FIG. 8A, the processes to the formation of the contact plugs 16s and 16d are performed.

Next, as illustrated in FIG. 8B, the wirings 17 in contact with the contact plugs 16s and 16d are formed. Note that, in forming the wirings 17, firstly, a titanium nitride film whose thickness is approximately 150 nm, an AlCu alloy film whose thickness is approximately 550 nm, a titanium film whose thickness is approximately 5 nm, and a titanium nitride film whose thickness is approximately 150 nm are sequentially formed by a PVD method or the like. Next, patterning of these films is performed.

After forming the wirings 17, a heat treatment in which a vertical furnace is used, the temperature of the semiconductor substrate 1 is 350° C., the treatment time is for 30 minutes, and the supply amount of nitrogen gas is 20 l/minute is performed. Next, as illustrated in FIG. 8B, the NSG film 52 is formed on the entire surface by a plasma CVD method using TEOS or the like. The thickness of the NSG film 52 may be set to be approximately 300 nm.

Thereafter, similarly to the fourth embodiment, the processes from the formation of the SOG film 22 are performed.

According to this sixth embodiment as well, the same effect as that of the fourth embodiment can be obtained.

Note that, in forming the SOG film 12, before applying the coating solution thereof, an organic solvent may be applied on the silicon oxynitride film 11. As the organic solvent, for example, ethanol, isopropyl alcohol, xylene, and the like can be cited. In applying the organic solvent, for example, a spin coater is used, and the semiconductor substrate may be spun at a speed of 1000 times/minute for approximately two seconds to ten seconds.

Note that these embodiments may be combined with one another. Further, the formation of the NSG film 25 may be omitted. Further, the formation of the SOG film 24 may be omitted.

Further, in place of the aluminum oxide films 53 and 54, as a barrier film preventing moisture from being permeated, a metal oxide film such as a titanium oxide film, a zirconium oxide film, a magnesium oxide film, and a magnesium titanium oxide film may be used.

Further, in the above-described embodiments, although the main cure is collectively performed with respect to a plurality of SOG films, the main cure may be performed in each SOG film. Further, the precure with respect to the SOG films 12 and 22 may be omitted.

Here, an experiment that the present inventor conducted will be explained. In this experiment, samples according to the first embodiment and the sixth embodiment were made. With regard to the first embodiment, the NSG film 51 was formed in place of the SOG films 12 to 14. Further, with regard to the sixth embodiment, the NSG film 51 was formed in place of the SOG films 12 to 14 and the aluminum oxide film 53. Then, with respect to these samples, calculation of the number of defects based on image comparison of an optical microscope used in an optical defect inspection apparatus was performed, and thereby, the number of defects caused in the contact plug was calculated. Further, as comparison, as for a sample made according to the conventional method illustrated in FIG. 9A to FIG. 9G, as well, the number of defects caused in the contact plug was calculated. Results thereof are illustrated in Table 1.

TABLE 1

|  | The first embodiment | The sixth embodiment | The conventional method |
| --- | --- | --- | --- |
| The number of defects | 82 | 67 | 233 |

These results indicate that a rise of contact resistance can be suppressed by the first and sixth embodiments.

Note that in Patent Document 1, the technique in which a lyophilic film such as an oxide film is formed before applying a coating solution of SOG is disclosed, but it is difficult to secure sufficient wettability. Further, description about forming two types of SOG films by using coating solutions whose viscosities are different does not exist. Further, even though the lyophilic film such as an oxide film is formed, if the viscosity of a coating solution of SOG is high enough to form a film whose thickness is equal to or more than 100 nm, the coating solution cannot penetrate into a micro crack and gap.

In Patent Document 2, the technique in which, in forming an interlayer insulating film having a two-layer structure, a plasma oxide film is formed before forming an interlayer insulating film of the second layer is disclosed. However, a void caused in forming an interlayer insulating film of the first layer cannot be prevented. Further, description about forming two types of SOG films by using coating solutions whose viscosities are different does not exist.

In Patent Document 3, the technique in which fluorine or a fluorine ion is made to be contained in a coating solution of SOG is disclosed. However, it is difficult to secure sufficient wettability. Further, description about forming two types of SOG films by using coating solutions whose viscosities are different does not exist. Further, even though wettability is improved, if the viscosity of a coating solution of SOG is high enough to form a film whose thickness is equal to or more than 100 nm, the coating solution cannot penetrate into a micro crack and gap.

In Patent Document 4, the technique in which a thicker interlayer insulating film is formed by applying a coating solution of SOG once is disclosed. However, occurrence of a void cannot be suppressed. Further, description about forming two types of SOG films by using coating solutions whose viscosities are different does not exist.

INDUSTRIAL APPLICABILITY

According to the present invention, after forming a first coating-type insulating film by using a coating solution having a low viscosity, a second coating-type insulating film is formed by using a coating solution having a high viscosity, so that a flat insulating film can be obtained without causing a void.

What is claimed is:

1. A manufacturing method of a semiconductor device comprising:
   forming a structure having a level difference above a semiconductor substrate;
   forming a silicon oxynitride film over the structure;
   applying an organic solvent including any one of ethanol, isopropyl alcohol and xylene on the silicon oxynitride film;
   after applying the organic solvent, forming a first coating-type insulating film over the silicon oxynitride film with using a first coating solution; and
   forming a second coating-type insulating film thicker than a height of the structure on the first coating-type insulating film with using a second coating solution whose viscosity is higher than that of the first coating solution.

2. The manufacturing method of a semiconductor device according to claim 1, wherein, as the structure, a gate electrode is formed.

3. The manufacturing method of a semiconductor device according to claim 1, wherein, as the structure, a wiring is formed.

4. The manufacturing method of a semiconductor device according to claim 1, wherein the second coating-type insulating film is thicker than the first coating-type insulating film.

5. The manufacturing method of a semiconductor device according to claim 1, wherein, as the second coating-type insulating film, an insulating film having a two-layer structure is formed.

6. The manufacturing method of a semiconductor device according to claim 1, wherein a thickness of the first coating-type insulating film is equal to or less than 50 nm.

7. The manufacturing method of a semiconductor device according to claim 1, further comprising forming a barrier film preventing moisture from being permeated on the second coating-type insulating film.

8. The manufacturing method of a semiconductor device according to claim 7, wherein a thickness of the barrier film is equal to or less than 20 nm.

9. The manufacturing method of a semiconductor device according to claim 7, wherein, as the barrier film, one selected from a group composed of an aluminum oxide film, a titanium oxide film, a zirconium oxide film, a magnesium oxide film, and a magnesium titanium oxide film is formed.

10. The manufacturing method of a semiconductor device according to claim 7, further comprising forming an insulating film on the barrier film.

11. The manufacturing method of a semiconductor device according to claim 4, wherein
    the forming the first coating-type insulating film comprises:
    applying the first coating solution; and
    curing the first coating solution at a first temperature,
    the forming the second coating-type insulating film comprises:
    applying the second coating solution; and
    curing the second coating solution at a second temperature, and
    the manufacturing method further comprising, after the forming the second coating-type insulating film, curing the first and second coating-type insulating films at a third temperature higher than the first and second temperatures.

12. The manufacturing method of a semiconductor device according to claim 11, wherein, in the forming the second coating-type insulating film, the applying the second coating solution and the curing the second coating solution at a second temperature are repeated two times.

13. The manufacturing method of a semiconductor device according to claim 1, wherein, as the first and second coating solutions, a coating solution of spin on glass is used.

14. The manufacturing method of a semiconductor device according to claim 11, wherein moisture contained in the first coating solution is volatilized by the curing the first coating solution.

15. The manufacturing method of a semiconductor device according to claim 11, wherein the first temperature is 100° C. to 200° C.

16. The manufacturing method of a semiconductor device according to claim 11, wherein a time for the curing the first coating solution is for one minute to three minutes.

17. The manufacturing method of a semiconductor device according to claim 11, wherein the curing the first coating solution is performed in an inert gas atmosphere.

18. The manufacturing method of a semiconductor device according to claim 1, wherein a viscosity of the first coating solution is a viscosity in which a coating film whose thickness is 10 nm to 50 nm is allowed to be obtained in a case when the first coating solution is supplied to a coater while spinning the coater at a speed of 2000 rpm to 4000 rpm.

19. The manufacturing method of a semiconductor device according to claim 5, wherein in the forming the second coating-type insulating film, the applying the second coating solution is performed two times.

20. The manufacturing method of a semiconductor device according to claim 5, wherein each layer of the insulating film having the two-layer structure is thicker than the first coating-type insulating film.

* * * * *